(12) United States Patent
Manduchi et al.

(10) Patent No.: US 6,192,336 B1
(45) Date of Patent: *Feb. 20, 2001

(54) METHOD AND SYSTEM FOR SEARCHING FOR AN OPTIMAL CODEVECTOR

(75) Inventors: Roberto Manduchi, San Francisco; Dulce Ponceleon, Palo Alto; Ke-Chiang Chu, Saratoga; Hsi-Jung Wu, Mountain View, all of CA (US)

(73) Assignee: Apple Computer, Inc., Cupertino, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/723,005

(22) Filed: Sep. 30, 1996

(51) Int. Cl.⁷ .................................................. G10L 19/12
(52) U.S. Cl. .............................................................. 704/230
(58) Field of Search .................................. 704/222, 230, 704/201

(56) References Cited

U.S. PATENT DOCUMENTS

| | | | |
|---|---|---|---|
| 3,979,557 | 9/1976 | Schulman et al. | 704/207 |
| 4,944,013 | 7/1990 | Gouvianakis | 381/38 |
| 5,010,574 | * 4/1991 | Wang | 704/222 |
| 5,091,945 | 2/1992 | Kleijn | 381/36 |
| 5,127,053 | 6/1992 | Koch | 704/207 |
| 5,142,584 | 8/1992 | Ozawa | 381/36 |
| 5,195,137 | * 3/1993 | Swaminathan | 704/222 |
| 5,216,747 | 6/1993 | Hardwick et al. | 704/200 |
| 5,230,036 | 7/1993 | Akamine | 704/219 |
| 5,271,089 | * 12/1993 | Ozawa | 704/222 |
| 5,323,486 | * 6/1994 | Taniguchi | 704/222 |
| 5,377,301 | * 12/1994 | Rosenberg et al. | 704/222 |
| 5,455,888 | 10/1995 | Iyengar | 704/219 |
| 5,481,739 | 1/1996 | Staats | 395/800 |
| 5,487,128 | * 1/1996 | Ozawa | 704/222 |
| 5,491,772 | 2/1996 | Hardwick et al. | 704/226 |
| 5,574,823 | 11/1996 | Hassanein | 704/205 |
| 5,596,676 | 1/1997 | Swaminathan | 704/219 |
| 5,642,464 | 6/1997 | Yue | 704/219 |
| 5,664,055 | 9/1997 | Kroon | 704/223 |

* cited by examiner

*Primary Examiner*—Krista Zele
*Assistant Examiner*—Michael N. Opsasnick
(74) *Attorney, Agent, or Firm*—Sawyer Law Group LLP

(57) ABSTRACT

Method and system aspects for searching for an optimal codevector from a plurality of codevectors in a codebook, the optimal codevector having a minimum distance to a given vector, are provided. The aspects determine a partial distance with a current vector component of a current codevector and of the given vector, compare the partial distance to a saved renormalized minimum partial distance, and proceed to a next codevector when the saved renormalized minimum partial distance is smaller than the partial distance.

In addition, the present invention proceeds to a next vector component when the partial distance is smaller than the saved renormalized minimum partial distance. When the partial distance computed with each next vector component is smaller than the saved renormalized minimum partial distance, the present invention calculates a full weighted distance value, compares it to a saved minimum full weighted distance, and updates chosen values. The operation then continues with a next codevector until all codevectors have been used. An optimal index to identify the optimal codevector is returned when all codevectors have been used.

25 Claims, 3 Drawing Sheets

METHOD AND SYSTEM FOR SEARCHING FOR AN OPTIMAL CODEVECTOR

FIELD OF THE INVENTION

The present invention relates to lossy coding systems, and more particularly to vector quantization for use in codebook-based coding systems.

BACKGROUND OF THE INVENTION

Digital speech processing typically can serve several purposes in computers. In some systems, speech signals are merely stored and transmitted. Other systems employ processing that enhances speech signals to improve the quality and intelligibility. Further, speech processing is often utilized to generate or synthesize waveforms to resemble speech, to provide verification of a speaker's identity, and/or to translate speech inputs into written outputs.

In some speech processing systems, speech coding is performed to reduce the amount of data required for signal representation, often with analysis by synthesis adaptive predictive coders, including various versions of vector or code-excited coders. In the predictive systems, models of the vocal cord shape, i.e., the spectral envelope, and the periodic vibrations of the vocal cord, i.e., the spectral fine structure of speech signals, are typically utilized and efficiently performed through slowly, time-varying linear prediction filters.

These models typically utilize parameters to replicate as closely as possible the original speech signal. There tends to be numerous parameters involved in such modeling. Compression schemes are often employed to reduce the number of parameters requiring transmission in the processing system. One such technique is known as vector quantization.

Generally, vector quantization schemes, whether in speech processing or other large data modeling systems, such as image processing systems, employ a codebook or vocabulary of codevectors, and an index to the codebook. An optimal codevector in the codebook relative to an input vector is usually determined through intensive computations. An index to the optimal codevector is then transmitted. Thus, vector quantization effectively reduces the amount of information transmitted by transmitting only an indexed reference to the codevector, rather than the entire codevector. Unfortunately, the intensive computations typically involved in the determination of the optimal codevector are time-consuming and thus expensive. Accordingly, a need exists for a more efficient search strategy in vector quantization.

SUMMARY OF THE INVENTION

The present invention addresses such a need and provides method and system aspects for searching for an optimal codevector from a plurality of codevectors in a codebook, the optimal codevector having a minimum weighted distance to a given vector. The preferred aspects determine a partial distance with a current vector component of a current codevector and the corresponding component of the given vector, compare the partial distance to a saved "renormalized" minimum partial distance, and proceed to a next codevector when the saved renormalized minimum partial distance is smaller than the partial distance.

In addition, the present invention proceeds to a next vector component when the partial distance is smaller than the corresponding saved renormalized minimum partial distance. When the partial distance computed with each next vector component is smaller than the saved renormalized minimum partial distance, the present invention calculates a full weighted distance value. Further, the weighted full distance is compared to a saved minimum full weighted distance, and when the full weighted distance is smaller than the saved minimum full weighted distance, an optimal index to the current codevector is updated, the saved minimum full weighted distance is updated to the full weighted distance, and the new renormalized minimum partial distances are determined and stored. The operation then continues with a next codevector until all codevectors have been used. An optimal index to identify the optimal codevector is then returned when all codevectors in the codebook have been used.

With the present invention, an advantageous computation of partial distance values reduces the computational load of searching for an optimal codevector in a given codebook. Further, the present invention achieves such advantage without restricting the codebook to a predefined structure or performing preliminary processing to determine a structure for the codebook. These and other advantages of the aspects of the present invention will be more fully understood in conjunction with the following detailed description and accompanying drawings.

DESCRIPTION OF THE INVENTION

The present invention relates to weighted vector quantization for use in lossy coding systems, e.g., audio and video processing system. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

For weighted vector quantization based coding systems, typically a given, N-dimensional vector, 'v', is approximated by a coded vector, 'u', in a codebook of M codevectors. By way of example, the given vector, 'v', may be a sequence of 'N' linear predictive coefficients derived from an analysis of a speech segment in a speech encoding system. Each codevector 'u' in the codebook is indexed by an integer index, j. In choosing the codevector 'u' that best approximates the given vector 'v', a weighted quadratic distance, $D^2$, to the given vector 'v' is determined via $$D^2 = \sum_{i=0}^{N-1} w_i(u_i - v_i)^2;$$

equation (1), where $\{v_i\}$ are the components of the given vector 'v', $\{u_i\}$ are the components of the codevector 'u', and $\{w_i\}$ are non-negative weights chosen prior to and appropriate for the search, as is well understood by those skilled in the art. The best codevector is thus the codevector that minimizes the weighted quadratic distance to the given vector 'v', and is conventionally determined using a direct search strategy.

Figure 1:
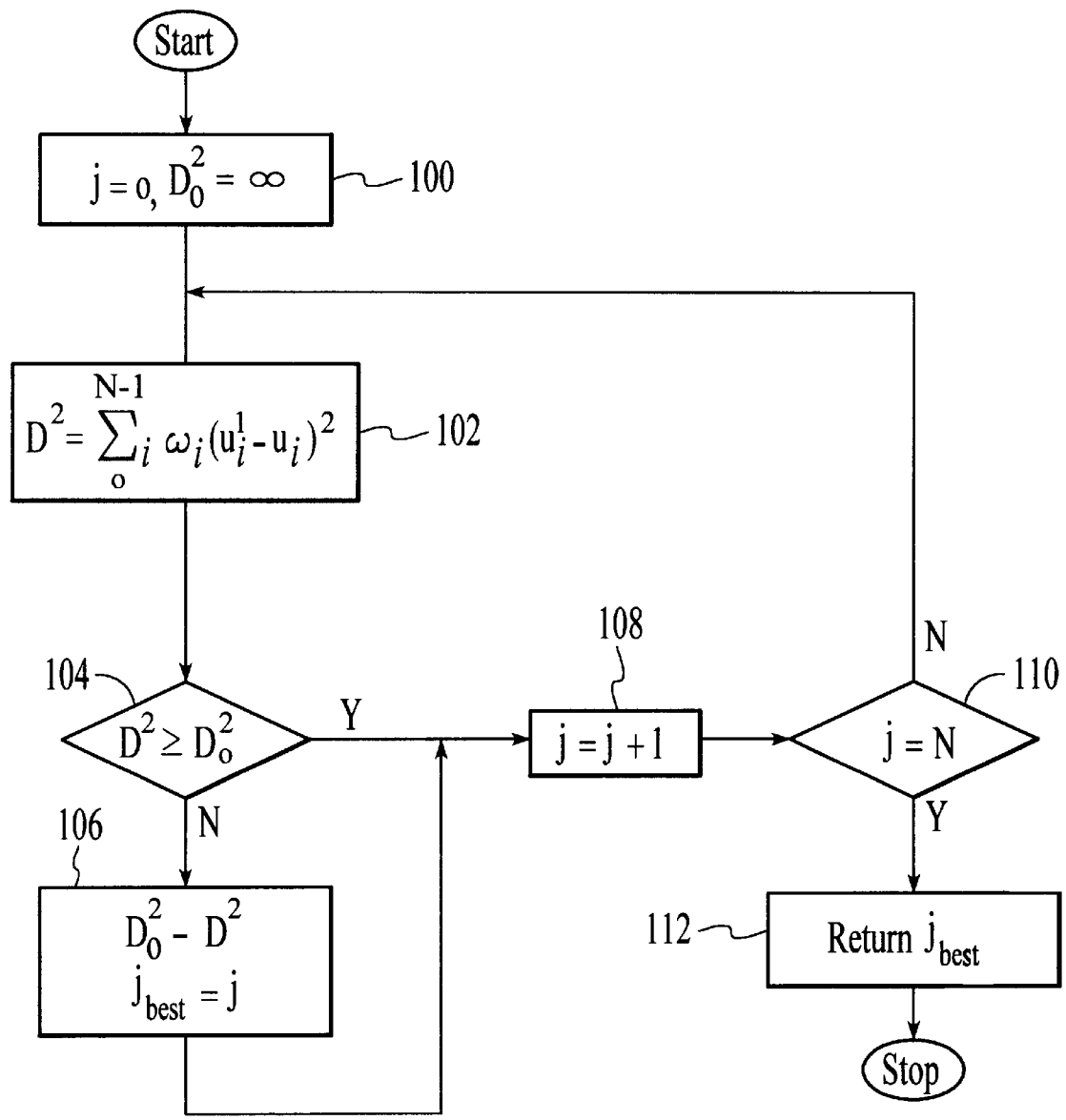
FIG. 1 illustrates a flow diagram of a renormalized, weighted vector quantization search strategy of the prior art.

FIG. 1 illustrates a typical direct search strategy. The method begins with an initialization of an index variable, j, and a minimum weighted distance variable, $D^2_o$ (step 100). The method continues with a determination of the weighted distance, $D^2$, (step 102) by substituting the appropriate values into equation (1). The variable $u^j_i$, as shown in FIG. 1, suitably represents the ith component of the jth codevector. Once the computation is completed, a comparison between the computed weighted distance value, $D^2$, and the stored minimum weighted distance value, $D^2_o$, is performed (step 104).

When the computed weighted distance value is smaller than the stored minimum weighted distance value, the minimum weighted distance value is updated to the computed weighted distance value and a variable for the position of the best index value, $j_{best}$, is updated to the current index value j (step 106). When the computed weighted distance value is not smaller than the stored minimum weighted distance value or upon completion of the updating, the index value is incremented (step 108). The process then continues with steps 102, 104, 106, and 108, until all M codevectors in the codebook have been tested (step 110). Once all of the codevectors have been tested, the value stored as $j_{best}$ is returned (step 112) to point to the optimal codevector in the codebook that minimizes the weighted distance to 'v'.

While such methods do return an optimal codevector from a codebook for minimizing the weighted distance to the current vector, the heavy computation involved in performing the weighted distance calculation of every codevector is highly time-consuming. Some schemes have been proposed that reduce the burden such computations produce and are described in "Vector Quantization and Signal Compression", Gersho, A., et al., Kluwer Academic Publishers, Boston, 1995. The schemes generally fall into one of three categories. These categories comprise a category for those schemes that constrain the codebook to have a predefined structure and are not tolerant of a given codebook that cannot be constrained, a category for those schemes that, for a given codebook, determine some structure for the codebook in an initial phase and have significant memory requirements to memorize the structure, and a category for those schemes that simply accept any codebook and do not perform any analysis of the codebook. The present invention suitably belongs to third category and capably achieves a reduction in the average computational expense for a given codebook in a distinctive and effective manner.

Figure 2:
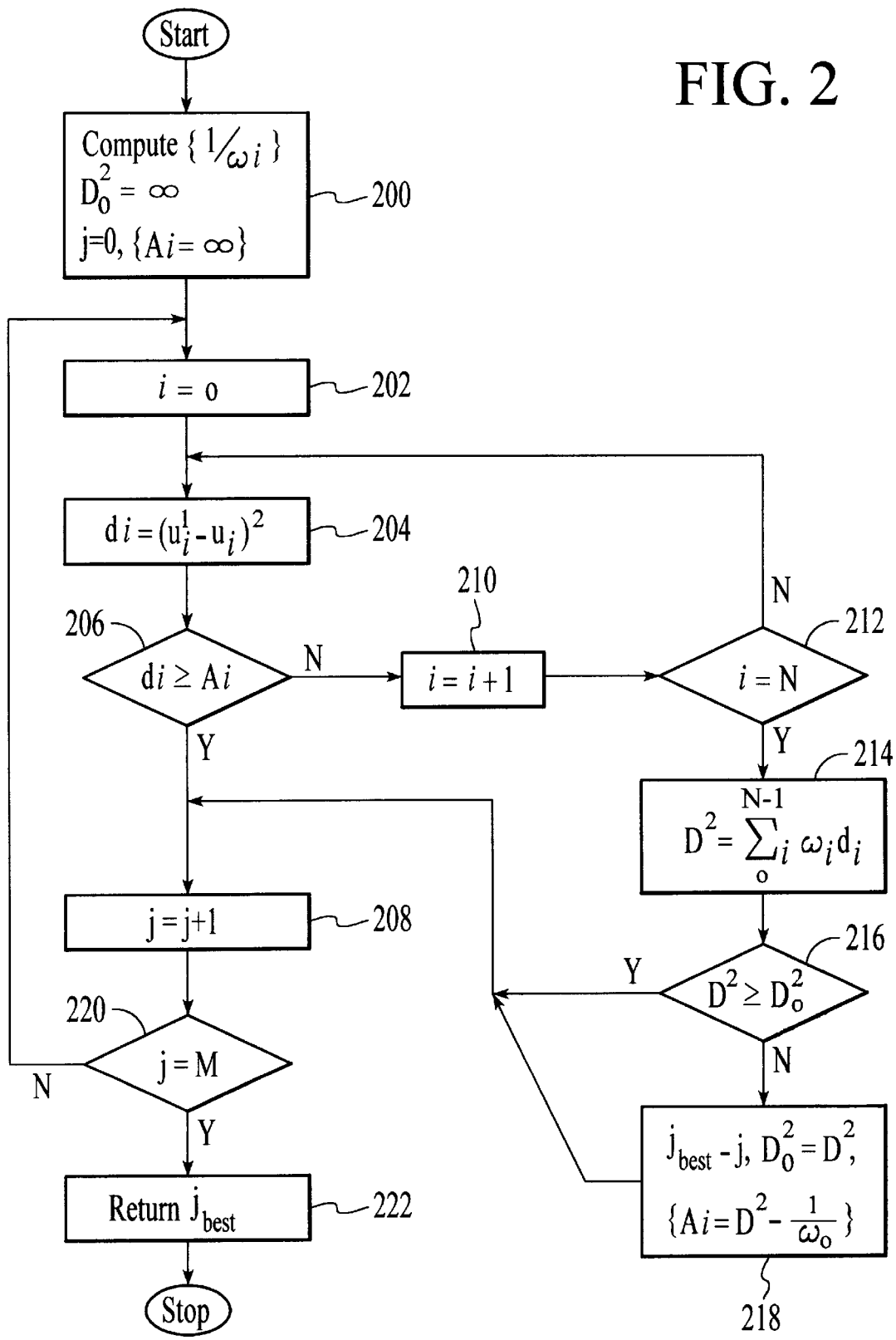
FIG. 2 illustrates a flow diagram of a weighted vector quantization search strategy in accordance with a preferred embodiment of the present invention.

FIG. 2 illustrates a preferred embodiment of the present invention. In general, the present invention recognizes that if the partial distance $d_i=(u_i-v_i)$ is greater than or equal to $C/w_i$, where C is a constant value, then the weighted distance, as defined by equation (1), will be greater than or equal to C, deriving immediately from the fact that the weights $\{w_i\}$ are all non-negative. Hence, if the minimum weighted distance found while testing a number of codevectors is $D^2_o$, and for the next codevector being tested, the ith partial distance $d_i$ is greater than or equal to the "renormalized" minimum partial distance $A_i$, where $A_i=D^2_o/w_i$, the codevector is not the best one.

Thus, the preferred embodiment proceeds with an initialization of several variables including a variable j, representing an index to the codebook, a set of variables $\{A_i\}$, representing the renormalized minimum partial distance values, a variable $D^2_o$ representing the minimum weighted distance, and a computation of the values for the inverse of each of the weights, $w_i$, (step 200). A variable i, representing an index of the vector component, is set equal to zero (step 202). A partial distance value $d_i$ is then computed (step 204), as shown by the equation in FIG. 2. A comparison between the computed partial distance value and the stored renormalized minimum partial distance value is then suitably performed (step 206). When the computed partial distance value is not smaller than the stored renormalized minimum partial distance value, the index of the codevector is incremented (step 208), so that a next codevector can be tested.

When the computed partial distance is smaller than the stored renormalized minimum partial distance, the index to the component of the codevector is incremented (step 210), and a determination of whether all of the 'N' components of the codevector have been tested is made (step 212). If all of the components have not been tested, the process continues from step 204 with a partial distance calculation with a next component. When all the components have been tested and all of the partial distances are smaller than the stored minimum partial distance, the process suitably continues by computing a full weighted distance value, $D^2$, (step 214) by summing together the partial distances, after multiplication with the corresponding weights, as shown by FIG. 2. While each partial distance may be smaller than the corresponding renormalized partial distance, the codevector may still not provide a weighted distance smaller than $D^2_o$ when the weight values are taken more fully into consideration in the full weighted distance computation. Thus, a comparison is then appropriately performed between the computed full weighted distance and the stored minimum weighted distance value (step 216).

When the full weighted distance is smaller than the stored minimum weighted distance, the full weighted distance value updates the stored minimum weighted distance value, the index of the codevector updates a best index variable, $j_{best}$, and the renormalized minimum partial distance values are updated by multiplying the full weighted distance by the computed inverse weight values (step 218). When the full weighted distance is not smaller than the stored minimum weighted distance $D^2_o$, or when the updating (step 218) is completed, the process continues with the next codevector (step 208). When all of the M codevectors in the codebook have been tested (step 220), the index of the best codevector, $j_{best}$, is returned (step 222), and the process is completed.

Comparing the number of computations between the direct search strategy, as described with reference to FIG. 1, and the search strategy of the present invention, as described with reference to FIG. 2, illustrates more particularly the advantages of the present invention. For the direct search strategy, the computation of $D^2$ with one vector having 'N' parameters involves 2N multiplications and (2N−1) sums. Thus, for a codebook with 'M' codevectors, the direct approach requires 2NM multiplications, (2N−1)M additions, and (M−1) comparisons.

For the approach of the present invention, the number of operations depends on many factors, including how close the first codevectors being tested are to the input vector. An average number of calculations can be determined, however, as is well understood by those skilled in the art, for use in the comparison of the computational burden of each of the approaches. Thus, on average, the present invention requires approximately (13/20 NM +N $\log_2$M) multiplications, (13/20 NM −M/10) sums, and (11/20 NM +M/10) comparisons. Of course, there are also 'N' divisions at the beginning of the search to determine the value for $1/w_i$, however, the cost of those divisions is often split over the approximation of several vectors when the same weights are used.

With a system that has vectors characterizing 10 parameters (N=10) and a codebook with 256 codevector entries (M=256), the direct search strategy requires 5120 multiplications, 4864 additions, and 255 comparisons. For the present invention under such circumstances, on average, the strategy requires approximately 1744 multiplications, 1639 sums, and 1433 comparisons. Thus, a clear advantage is achieved through the present invention to reduce the computational burden of performing searches in weighted vector quantization.

Figure 3:
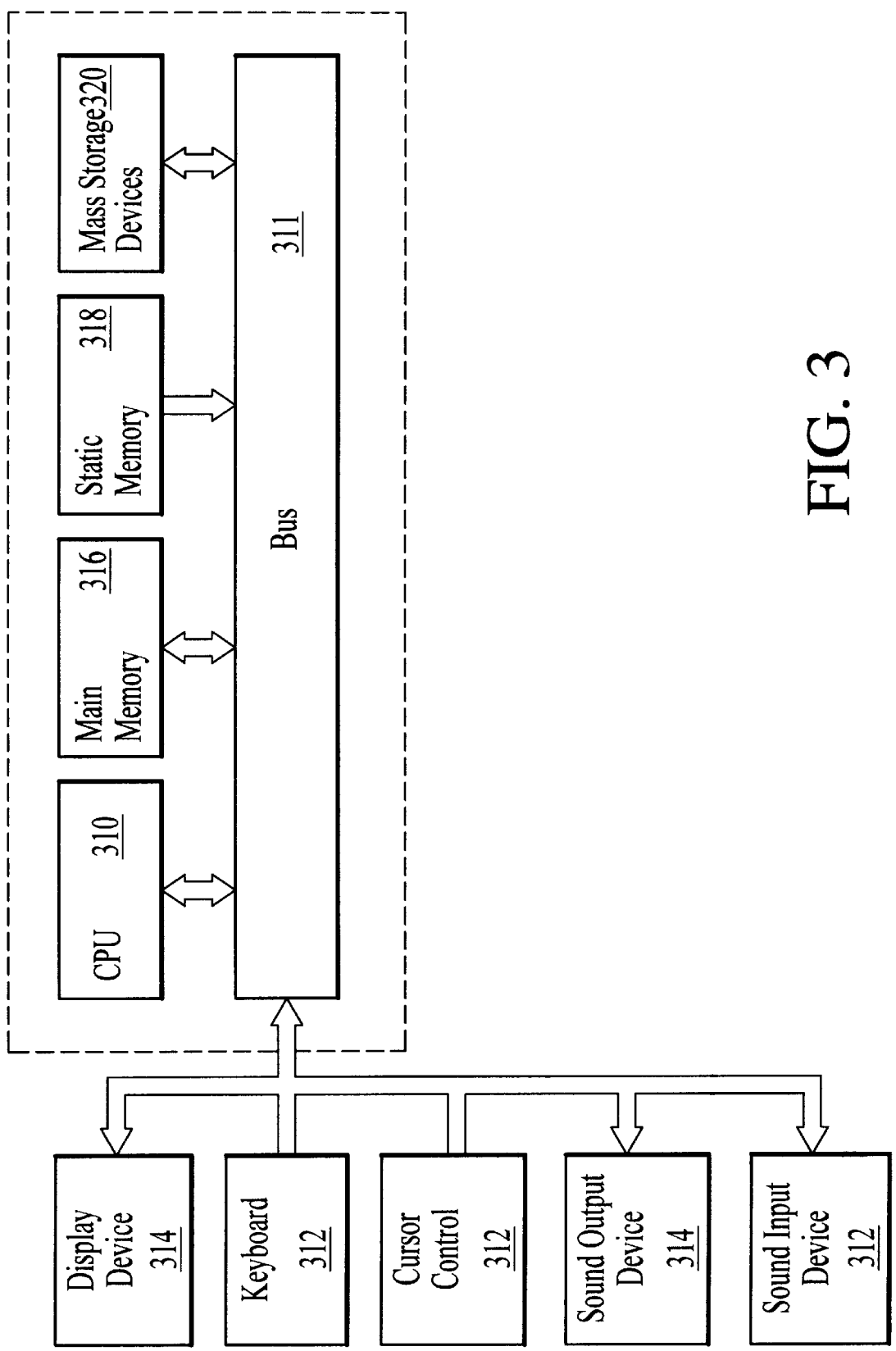
FIG. 3 illustrates a block diagram of a computer system capable of facilitating the implementation of the preferred embodiment.

Such advantageous determinations are suitably performed by and implemented in a computer system, e.g., the computer system of FIG. 3, which illustrates a block diagram of a computer system capable of coordinating the vector quantization search strategy in accordance with the present invention. Included in the computer system are a central processing unit (CPU) 310, coupled to a bus 311 and interfacing with one or more input devices 312, including a cursor control/mouse/stylus device, keyboard, and speech/sound input device, such as a microphone, for receiving speech signals. The computer system further includes one or more output devices 314, such as a display device/monitor, sound output device/speaker, printer, etc, and memory components, 316, 318, e.g., RAM and ROM, as is well understood by those skilled in the art. Of course, other components, such as A/D converters, digital filters, etc., are also suitably included for speech signal generation of digital speech signals, e.g., from analog speech input, as is well appreciated by those skilled in the art. The computer system preferably controls operations necessary for the search strategy in weighted vector quantization of the present invention, suitably performed using a programming language, such as C, C++, and the like, and stored on an appropriate storage medium 320, such as a hard disk, floppy diskette, etc., which also suitably stores the given codebook.

Although the present invention has been described in accordance with the embodiments shown, one of ordinary skill in the art will readily recognize that there could be variations to the embodiments and those variations would be within the spirit and scope of the present invention. For example, although the foregoing is described with reference to a speech processing system, other systems, such as image processing systems, that employ weighted vector quantization searching strategies are suitably improved by incorporating the features of the present invention. Accordingly, many modifications may be made by one of ordinary skill in the art without departing from the spirit and scope of the appended claims.

What is claimed is:

1. A method for searching for an optimal codevector from a plurality of codevectors in a codebook for data modeling of input signals to a data processing system, including a system for processing speech signals, the optimal codevector having a minimum weighted distance to a given vector, the codevectors comprising a plurality of components, the method comprising:

determining, for an input signal to a processing system to convert the input signal from an analog representation to a digital representation, a partial distance between a current vector component of a current codevector and of a corresponding component of the given vector;

comparing the partial distance to a saved renormalized minimum partial distance; and proceeding to a next codevector when the saved renormalized minimum partial distance is smaller than the partial distance, whereby an optimal representation of the input signal as a digital signal in the processing system is efficiently achieved.

2. The method of claim 1 further comprising proceeding to a next vector component when the partial distance is smaller than the saved renormalized minimum partial distance.

3. The method of claim 2 further comprising calculating a full weighted distance value by summing together the partial distance computed with each next vector component after multiplication with corresponding weights when the partial distance computed with each next vector component is smaller than the saved renormalized minimum partial distance.

4. The method of claim 3 further comprising comparing the full weighted distance to a saved minimum full weighted distance.

5. The method of claim 4 further comprising updating an optimal index to the current codevector, updating the saved minimum full weighted distance to the full weighted distance, and updating the saved renormalized minimum partial distance when the full weighted distance is smaller than the saved minimum full weighted distance.

6. The method of claim 5 further comprising continuing with a next codevector until all of the plurality of codevectors have been used.

7. The method of claim 4 further comprising continuing with a next codevector when the saved minimum full weighted distance is smaller than the full weighted distance until all of the plurality of codevectors have been used.

8. The method of claim 6 further comprising returning the optimal index to identify the optimal codevector when all of the plurality of codevectors in the codebook have been used.

9. The method of claim 5 wherein updating the saved renormalized minimum partial distance further comprises multiplying the full weighted distance by an inverse value for each of a plurality of weight values.

10. The method of claim 9 wherein the inverse of each of the plurality of weight values is computed during initialization.

11. A system for searching for an optimal codevector from a plurality of codevectors in a codebook for data modeling of input signals to the system, including speech signals, the optimal codevector having a minimum distance to a given vector, the codevectors comprising a plurality of components, the system comprising:

storage medium storing the codebook; and a central processing unit (CPU) coupled to the storage medium and capable of coordinating the searching including determining, for an input signal to the system to convert the input signal from an analog representation to a digital representation, a partial distance between a current vector component of a current codevector and of a corresponding component of the given vector, comparing the partial distance to a saved renormalized minimum partial distance, and proceeding to a next codevector when the saved renormalized minimum partial distance is smaller than the partial distance, whereby an optimal representation of the input signal as a digital signal in the system is efficiently achieved.

12. The system of 11 wherein the CPU further coordinates proceeding to a next vector component when the partial distance is smaller than the saved renormalized minimum partial distance.

13. The system of 12 wherein the CPU further coordinates calculating a full weighted distance value by summing together the partial distance computed with each next vector component after multiplication with corresponding weights when the partial distance computed with each next vector component is smaller than the saved renormalized minimum partial distance.

14. The system of 13 wherein the CPU further coordinates comparing the full weighted distance to a saved minimum full weighted distance.

15. The system of 14 wherein the CPU further coordinates updating an optimal index to an index of the current codevector, updating the saved minimum full weighted distance to the full weighted distance, and updating the saved renormalized minimum partial distance when the full weighted distance is smaller than the saved minimum full weighted distance.

16. The system of 15 wherein the CPU further coordinates continuing with a next codevector until all of the plurality of codevectors have been used.

17. The system of 14 wherein the CPU further coordinates continuing with a next codevector when the saved minimum full weighted distance is smaller than the full distance until all of the plurality of codevectors have been used.

18. The system of 16 wherein the CPU further coordinates returning the optimal index to identify the optimal codevector when all of the plurality of codevectors in the codebook have been used.

19. A system for searching for an optimal codevector from a plurality of codevectors in a codebook, for data modeling of input signals to the system, including speech signals, the optimal codevector having a minimum distance to a given vector, the codevectors comprising a plurality of components, the system comprising:

means for storing the codebook; and means for utilizing the codebook, the means for utilizing coupled to the storing means and coordinating the searching, including determining, for an input signal to the system to convert the input signal from an analog representation to a digital representation, a partial distance between a current vector component of a current codevector and of a corresponding component of the given vector, comparing the partial distance to a saved renormalized minimum partial distance, and proceeding to a next codevector when the saved renormalized minimum partial distance is smaller than the partial distance, whereby an optimal representation of the input signal as a digital signal in the system is efficiently achieved.

20. The system of 19 wherein the means for utilizing further coordinates proceeding to a next vector component when the partial distance is smaller than the saved renormalized minimum partial distance.

21. The system of 20 wherein the means for utilizing further coordinates calculating a full weighted distance value by summing together the partial distance computed with each next vector component after multiplication with corresponding weights when the partial distance computed with each next vector component is smaller than the saved renormalized minimum partial distance, and comparing the full weighted distance to a saved minimum full weighted distance.

22. The system of 21 wherein the means for utilizing further coordinates updating an optimal index to an index of the current codevector, updating the saved minimum full weighted distance to the full weighted distance, and updating the saved renormalized minimum partial distance when the full weighted distance is smaller than the saved minimum full weighted distance, and continuing with a next codevector until all of the plurality of codevectors have been used.

23. The system of 22 wherein the means for utilizing further coordinates returning the optimal index to identify the optimal codevector when all of the plurality of codevectors in the codebook have been used.

24. A computer readable medium containing program instructions for searching for an optimal codevector from a plurality of codevectors in a codebook for data modeling of input signals to a data processing system, including a system for processing speech signals, the optimal codevector having a minimum distance to a given vector, the codevectors comprising a plurality of components, the program instructions comprising:

determining, for an input signal to a processing system, a partial distance with a current vector component of a current codevector and of the given vector;

comparing the partial distance to a saved renormalized minimum partial distance;

proceeding to a next codevector when the saved renormalized minimum partial distance is smaller than the partial distance; and proceeding to a next vector component when the partial distance is smaller than the saved renormalized minimum partial distance, whereby an optimal representation of the input signal in the processing system is efficiently achieved.

25. A computer readable medium containing program instructions for searching for an optimal codevector from a plurality of codevectors in a codebook for data modeling of input signals to a data processing system, including a system for processing speech signals, the optimal codevector having a minimum distance to a given vector, the codevectors comprising a plurality of components, the program instructions comprising:

determining, for an input signal to a processing system to convert the input signal from an analog representation to a digital representation, a partial distance with a current vector component of a current codevector and of the given vector;

comparing the partial distance to a saved renormalized minimum partial distance;

proceeding to a next codevector when the saved renormalized minimum partial distance is smaller than the partial distance; and proceeding to a next vector component when the partial distance is smaller than the saved renormalized minimum partial distance, whereby an optimal representation of the input signal as a digital signal in the processing system is efficiently achieved.

\* \* \* \* \*